United States Patent
Miyamoto et al.

(10) Patent No.: US 8,007,593 B2
(45) Date of Patent: Aug. 30, 2011

(54) REMOVER COMPOSITIONS

(75) Inventors: Sadaharu Miyamoto, Wakayama (JP); Yasushi Sasaki, Wakayama (JP)

(73) Assignee: Kao Corporation, Tokyo (JP)

( * ) Notice: Subject to any disclaimer, the term of this patent is extended or adjusted under 35 U.S.C. 154(b) by 833 days.

(21) Appl. No.: 11/988,943

(22) PCT Filed: Jun. 5, 2006

(86) PCT No.: PCT/JP2006/311183
§ 371 (c)(1),
(2), (4) Date: Jan. 17, 2008

(87) PCT Pub. No.: WO2007/010679
PCT Pub. Date: Jan. 25, 2007

(65) Prior Publication Data
US 2009/0149025 A1    Jun. 11, 2009

(30) Foreign Application Priority Data
Jul. 21, 2005   (JP) .................. 2005-211911

(51) Int. Cl.
*B08B 3/12* (2006.01)

(52) U.S. Cl. ......... 134/1; 134/2; 134/3; 134/26; 134/27; 134/28; 134/29; 134/30; 134/34; 134/36; 134/41; 134/42; 134/902; 510/175; 510/469; 510/489

(58) Field of Classification Search ........... 510/175, 510/469, 489; 134/2, 3, 26, 27, 28, 29, 30, 134/34, 36, 41, 42, 902
See application file for complete search history.

(56) References Cited

U.S. PATENT DOCUMENTS

| | | | |
|---|---|---|---|
| 5,174,816 | A | 12/1992 | Aoyama et al. |
| 6,080,709 | A | 6/2000 | Ishikawa et al. |
| 6,686,322 | B1 | 2/2004 | Nohara et al. |
| 7,250,391 | B2 | 7/2007 | Kanno et al. |
| 2002/0009674 | A1 | 1/2002 | Nohara et al. |
| 2002/0077259 | A1 | 6/2002 | Skee |
| 2006/0293199 | A1 * | 12/2006 | Tamura et al. ............. 510/175 |

FOREIGN PATENT DOCUMENTS

| JP | 4-48633 A | 2/1992 |
|---|---|---|
| JP | 11-74180 A | 3/1999 |
| JP | 11-131093 A | 5/1999 |
| JP | 2000-147794 A | 5/2000 |
| JP | 2000-284506 A | 10/2000 |
| JP | 2004-4775 A | 1/2004 |
| JP | 2004-511917 A | 4/2004 |
| JP | 2004-317584 A | 11/2004 |
| JP | 2005-165263 A | 6/2005 |

OTHER PUBLICATIONS

Machine Translation of JP 2005-165263A.*
English language abstract of JP 2004-094203 (Mar. 25, 2004).
English language abstract of JP 2001-168015 (Jun. 22, 2001).
English language abstract of JP 2004-004775 (2004-01-08).
Japanese Office Action issued Jun. 22, 2010, in Japanese Application No. 2005-211911, with translation.
Office Action mailed Apr. 7, 2010 in Chinese Application No. 200680025743.8

* cited by examiner

*Primary Examiner* — Sharidan Carrillo
(74) *Attorney, Agent, or Firm* — Birch, Stewart, Kolasch & Birch, LLP

(57) ABSTRACT

A remover composition containing 1,3-propanediamine (a), 1-hydroxyethylidene-1, 1-diphosphonic acid (b) and water, wherein the remover composition contains the component (a) in an amount of from 0.2 to 30% by weight, the component (b) in an amount of from 0.05 to 10% by weight, and the water in an amount of from 60 to 99.75% by weight, and wherein the composition has a pH at 20° C. of from 9 to 13; and a remover composition containing an organic amine (A), an organic phosphonic acid (B), a linear sugar alcohol (C) and water, wherein the remover composition contains the component (A) in an amount of from 0.2 to 30% by weight, the component (B) in an amount of from 0.05 to 10% by weight, the component (C) in an amount of from 0.1 to 10% by weight, and the water in an amount of from 50 to 99.65% by weight, and wherein the composition has a pH at 20° C. of from 9 to 13.

3 Claims, No Drawings

REMOVER COMPOSITIONS

TECHNICAL FIELD

The present invention relates to a remover composition used for removing a resist residue that remains after a resist used in a step of forming a semiconductor element on a semiconductor substrate such as a silicon wafer is removed by ashing, and a metal oxide product derived from metal line (the resist residue and the metal oxide product derived from metal line may be hereinafter collectively referred to as ashing residue in some cases), especially ashing residue within via holes; a process for cleaning a semiconductor substrate or semiconductor element with the remover composition; and a method for manufacturing a semiconductor substrate or semiconductor element including the step of cleaning with the cleaning process.

BACKGROUND ART

In the method for manufacturing of a semiconductor element on a semiconductor substrate such as a silicon wafer, a thin film is formed by a method such as sputtering, and given patterns are formed with a resist on the thin film by lithography. The method includes the steps of etching the formed patterns as an etching resist to selectively remove the thin film in a lower layer part, forming via holes, and thereafter subjecting the resist obtained to ashing, thereby removing the resist. A series of these steps are repeated to give a manufactured article of a semiconductor element.

Since residue generated after the etching or ashing or via hole-forming mentioned above can be a cause for disadvantages such as contact failure, it is earnestly desired to carry out residue removal at a high level.

Conventionally, in order to remove the residue as mentioned above, a cleaning liquid containing a fluorine-containing compound (see, for example, Patent Publication 1) has been mainly used. In addition, a water-based cleaning agent has been proposed, from the viewpoint of suppression of corrosion of aluminum line and environmental-friendliness (see, for example, Patent Publications 2 and 3). Also, an aqueous alkaline composition has been proposed from the viewpoint of removal of residue and suppression of corrosion of aluminum line and environmental-friendliness (see, for example, Patent Publication 4).

Patent Publication 1: JP 2004-94203 A
Patent Publication 2: JP 2001-168015 A
Patent Publication 3: JP-Hei-11-131093 A
Patent Publication 4: JP 2004-511917 A

SUMMARY OF THE INVENTION

The present invention relates to:

[1] a remover composition containing 1,3-propanediamine (a), 1-hydroxyethylidene-1,1-diphosphonic acid (b) and water, wherein the remover composition contains the component (a) in an amount of from 0.2 to 30% by weight, the component (b) in an amount of from 0.05 to 10% by weight, and the water in an amount of from 60 to 99.75% by weight, and wherein the composition has a pH at 20° C. of from 9 to 13; and

[2] a remover composition containing an organic amine (A), an organic phosphonic acid (B), a linear sugar alcohol (C) and water, wherein the remover composition contains the component (A) in an amount of from 0.2 to 30% by weight, the component (B) in an amount of from 0.05 to 10% by weight, the component (C) in an amount of from 0.1 to 10% by weight, and the water in an amount of from 50 to 99.65% by weight, and wherein the composition has a pH at 20° C. of from 9 to 13.

DETAILED DESCRIPTION OF THE INVENTION

An object of the present invention is to provide a remover composition which has a low load to environments, excellent removability for resist residue generated after ashing and a metal oxide product derived from metal line (especially, aluminum-, copper- and titanium-based oxide products), and particularly ashing residue within via holes, even under cleaning conditions of lower temperatures and a shorter period of time, and excellent corrosion resistance to metal line (particularly, metal line containing aluminum); a process for cleaning a semiconductor substrate or semiconductor element with the composition; and a method for manufacturing a semiconductor substrate or semiconductor element including the step of cleaning with the cleaning process.

Recent manufacture of semiconductor elements shows a tendency of more limited production of diversified products. For this reason, the diameter of a silicon wafer is enlarged and the number of semiconductor elements obtained in a single manufacture is increased, thereby lowering the cost.

However, a batch processing cleaning process conventionally used for cleaning of semiconductor substrates or semiconductor elements (process of cleaning about 25 silicon wafers in one operation) is not likely to meet the needs for more limited production of diversified products, and increase in the size of a conveying equipment accompanying silicon wafers having larger diameters is also a new problem.

For solving such a problem, a case where a single wafer cleaning process (method of cleaning one silicon wafer at a time) is adopted in the cleaning of a semiconductor substrate or semiconductor element is increasing. However, how production efficiency can be maintained or improved is a problem for the single wafer cleaning process because a silicon wafer is cleaned one wafer at a time.

One of means for maintaining or improving production efficiency in the single wafer cleaning process includes a means in which the cleaning temperature is lowered and further shortens the cleaning time than those of a batch processing cleaning process, while satisfactorily keeping the detergency.

However, the residue remaining within via holes after forming via holes that reaches to an electroconductive layer on an insulation layer formed on the electroconductive layer containing aluminum and the electroconductive layer containing titanium, and removing the resist by ashing contain aluminum or titanium, so that it is very difficult to remove the residue remaining within the via holes even with an ordinary batch processing cleaning process in which a cleaning temperature is high and a cleaning time is long.

Therefore, for the purpose of maintaining or improving production efficiency, it is required in the single wafer cleaning process that an ashing residue can be sufficiently removed even under cleaning conditions of lower temperatures and a shorter period of time as compared to the batch processing cleaning process.

Removability under cleaning conditions of lower temperatures and a shorter period of time such as a single wafer cleaning process has not been conventionally designed, and it has been found that the above problem cannot be solved only by the introduction of techniques specifically disclosed in the above Patent Publications 1 to 4.

In view of the above, the present inventors have conducted various studies in order to solve the above problem. As a result, the present invention is accomplished thereby.

According to the present invention, a remover composition which has a low load to environments, excellent removability for resist residue generated after ashing and a metal oxide product derived from metal line (especially, aluminum-, copper- and titanium-based oxide products), and particularly removability for ashing residue within via holes, even under cleaning conditions of lower temperatures and a shorter period of time, and excellent corrosion resistance to metal line (particularly, metal line containing aluminum); a process for cleaning a semiconductor substrate or semiconductor element with the composition; and a method for manufacturing a semiconductor substrate or semiconductor element including the step of cleaning with the cleaning process can be provided.

One of the features of the remover composition of an embodiment 1 of the present invention resides in that the remover composition contains 1,3-propanediamine (a), 1-hydroxyethylidene-1,1-diphosphonic acid (b) and water in specified amounts, wherein the remover composition is adjusted to a specified pH. On the other hand, one of the features of the remover composition of an embodiment 2 resides in that the remover composition contains an organic amine (A), an organic phosphonic acid (B), a linear sugar alcohol (C) and water in specified amounts, wherein the remover composition is adjusted to a specified pH.

The water in the remover composition of the embodiment 1 and the embodiment 2 of the present invention includes ultrapure water, pure water, ion-exchanged water, distilled water and the like. Ultrapure water, pure water and ion-exchanged water are preferable, ultrapure water and pure water are more preferable, and ultrapure water is even more preferable. Here, pure water and ultrapure water refer to one obtained by passing tap water through activated carbon, subjecting the resulting water to ion exchange and then distillation, and optionally irradiating the distilled product with a given ultraviolet light under an ultraviolet lamp, or passing the distilled product through a filter. For example, the electric conductivity at 25° C. is, in many cases, 1 µS/cm or less for pure water, and 0.1 µS/cm or less for ultrapure water.

The content of the water of the embodiment 1 is from 60 to 99.75% by weight, of the remover composition. The content of the water can be from 60 to 98% by weight, from 70 to 97% by weight, from 75 to 96% by weight, or from 79 to 95% by weight, of the remover composition, from the viewpoint of chemical solution stability, operability, and environmental issues such as waste liquid treatment. In addition, of the viewpoint of environmental issues such as waste liquid treatment, the content of the water is preferably from 93 to 99.75% by weight, and more preferably from 93 to 99% by weight, from the viewpoint of reduction of COD (chemical oxygen demand) and from the viewpoint of pH stability. Here, in the present invention, the COD of the remover composition is determined on the basis of JIS K 0102 20.

The content of the water of the embodiment 2 is from 50 to 99.65% by weight of the remover composition. The content of the water is preferably from 60 to 98% by weight, more preferably from 70 to 97% by weight, even more preferably from 85 to 97% by weight, and even more preferably from 93 to 97% by weight, of the remover composition, from the viewpoint of chemical solution stability, operability, and environmental issues such as waste liquid treatment.

The remover composition of the embodiment 1 contains 1,3-propanediamine (a), 1-hydroxyethylidene-1,1-diphosphonic acid (b) and water in specified amounts, wherein the remover composition is adjusted to a specified pH.

The 1,3-propanediamine (a) is an aliphatic amine having two nitrogen atoms in one molecule, and has excellent removability for ashing residue and excellent corrosion resistance to metal line. The content of the 1,3-propanediamine is from 0.2 to 30% by weight of the remover composition of the embodiment 1. The content of the 1,3-propanediamine is preferably from 2 to 20% by weight, and more preferably from 3 to 15% by weight, of the remover composition, from the viewpoint of maintaining environmental issues such as waste liquid treatment, removability for ashing residue at lower temperatures in a shorter period of time, and corrosion resistance to metal line during rinsing with water. In addition, of the environmental issues such as waste liquid treatment, the content of the 1,3-propanediamine is preferably from 0.2 to 4% by weight, and more preferably from 0.5 to 4% by weight, of the remover composition, from the viewpoint of reduction of COD and from the viewpoint of pH stability.

In this embodiment, an organic amine other than the 1,3-propanediamine (a) (those, for example, exemplified in the embodiment 2) may be further used together. The amount of the other organic amine used in that case may be within the stoichiometric range mentioned above including the 1,3-propanediamine.

The 1-hydroxyethylidene-1,1-diphosphonic acid (b) has an excellent action of corrosion resistance to metal line. The content of the 1-hydroxyethylidene-1,1-diphosphonic acid is from 0.05 to 10% by weight of the remover composition of the embodiment 1. The content of the 1-hydroxyethylidene-1,1-diphosphonic acid is preferably from 1 to 10% by weight, more preferably from 1.5 to 8% by weight, and even more preferably from 2 to 6% by weight, of the remover composition, from the viewpoint of prevention of an organic amine from being added in excess and environmental issues including waste liquid treatment and the like. In addition, of the environmental issues such as waste liquid treatment, the content of the 1-hydroxyethylidene-1,1-diphosphonic acid is preferably from 0.05 to 6% by weight, and more preferably from 0.2 to 3% by weight, of the remover composition, from the viewpoint of reduction of COD and from the viewpoint of pH stability.

In this embodiment, an organic phosphonic acid other than the 1-hydroxyethylidene-1, 1-diphosphonic acid (b) (those, for example, exemplified in the embodiment 2) may be further used together. The amount of the other organic phosphonic acid used in that case may be within the stoichiometric range mentioned above including the 1-hydroxyethylidene-1, 1-diphosphonic acid.

A weight ratio of the 1,3-propanediamine (a) to the 1-hydroxyethylidene-1, 1-diphosphonic acid (b), i.e. (a)/(b), in the remover composition of the embodiment 1 of the present invention preferably from 1/1 to 7.5/1, more preferably from 1/1 to 3.5/1, and even more preferably from 1/1 to 2.2/1, from the viewpoint of satisfying both removability in a shorter period of time and corrosion resistance to metal line, and satisfying both the reduction in COD and pH stability.

In addition, it is preferable that the remover composition of the embodiment 1 of the present invention does not contain a linear sugar alcohol (those, for example, exemplified in the embodiment 2), from the viewpoint of increase in the amount of production per time period and reduction of COD.

The remover composition of the embodiment 2 contains an organic amine (A), an organic phosphonic acid (B), a linear sugar alcohol (C) and water in specified amounts, wherein the remover composition is adjusted to a specified pH, from the viewpoint of enhancing corrosion resistance in a case especially where the remover composition is contacted with the line containing aluminum.

The organic amine (A) has an action of dissolving ashing residue. The organic amine includes aliphatic amines, aromatic amines, cyclic amines, and the like, and the organic amines having one to four nitrogen atoms in one molecule are preferable. Specific examples include aliphatic amines having one nitrogen atom in one molecule, such as monoalkylamines having 1 to 20 carbon atoms, dialkylamines having 2 to 22 carbon atoms, and trialkylamines having 3 to 24 carbon atoms; aromatic amines having one nitrogen atom in one molecule, such as benzylamine, dibenzylamine, tribenzylamine, 1-aminonaphthalene, and alkylbenzylamines; aliphatic amines having two nitrogen atoms in one molecule, such as ethylenediamine, triethylenediamine, 1,2-propanediamine, 1,3-propanediamine, 1,6-hexanediamine, 1,2-cyclohexanediamine, 1,3-diaminoxylene, 1,3-bisaminocyclohexane, and tetramethylhexamethylenediamine; aliphatic amines having three nitrogen atoms in one molecule, such as diethylenetriamine; aliphatic amines having four nitrogen atoms in one molecule, such as triethylenetetramine; compounds prepared by adding an alkylene oxide having 2 to 4 carbon atoms to the above organic amines having one to four nitrogen atoms in one molecule (including alkanolamines such as monoethanolamine, monopropanolamine, monoisopropanolamine, diethanolamine, methyl monoethanolamine, butyl monoethanolamine, triethanolamine, dimethyl monoethanolamine, methyl diethanolamine, 2-amino-1-propanol, and 1-amino-2-propanol; alkoxyalkylamines such as 2-methoxyethylamine, 2-ethoxyethylamine, 3-methoxypropylamine, and 3-ethoxypropylamine; alkoxyalkanolamines such as 2-(2-aminoethoxy)ethanol and 2-(2-aminoethoxy)propanol); and cyclic amines having one to three nitrogen atoms in one molecule such as piperazine, piperidine, morpholine, and 1,2,4-triazole. These organic amines can be used alone or in a mixture of two or more kinds.

Among these organic amines, the aliphatic amines are preferable, from the viewpoint of excellent removability for ashing residue, excellent corrosion resistance to metal line, and environmental compatibility such as biodegradability. The aliphatic amines having two nitrogen atoms in one molecule are more preferable, and 1,2-propanediamine and 1,3-propanediamine are even more preferable, and 1,3-propanediamine is still even more preferable.

The content of the organic amine in the remover composition of the embodiment 2 of the present invention is from 0.2 to 30% by weight of the remover composition. The content of the organic amine is preferably from 2 to 20% by weight, and more preferably from 3 to 15% by weight, of the remover composition, from the viewpoint of maintaining environmental issues such as waste liquid treatment, and removability for ashing residue at lower temperatures in a shorter period of time and corrosion resistance to metal line during rinsing with water. In addition, of the environmental issues such as waste liquid treatment, the content of the organic amine is preferably from 0.2 to 4% by weight, and more preferably from 0.5 to 4% by weight, of the remover composition, from the viewpoint of reduction of COD and from the viewpoint of pH stability.

In the present invention, the organic phosphonic acid (B) has an action of corrosion resistance to metal line. The organic phosphonic acid includes methyldiphosphonic acid, aminotri(methylenephosphonic acid), ethylidenediphosphonic acid, 1-hydroxyethylidene-1,1-diphosphonic acid, 1-hydroxypropylidene-1,1-diphosphonic acid, 1-hydroxybutylidene-1,1-diphosphonic acid, ethylaminobis (methylenephosphonic acid), 1,2-propylenediaminetetra (methylenephosphonic acid), dodecylaminobis (methylenephosphonic acid), nitrotris(methylenephosphonic acid), ethylenediaminebis(methylenephosphonic acid), ethylenediaminetetra(methylenephosphonic acid), hexenediaminetetra(methylenephosphonic acid), diethylenetriaminepenta(methylenephosphonic acid), cyclohexanediaminetetra (methylenephosphonic acid) and the like. These organic phosphonic acids can be used alone or in a mixture of two or more kinds.

Among these organic phosphonic acids, aminotri(methylenephosphonic acid) and 1-hydroxyethylidene-1,1-diphosphonic acid are preferable from the viewpoint of having excellent corrosion resistance to metal line.

The content of the organic phosphonic acid in the remover composition of the embodiment 2 of the present invention is from 0.05 to 10% by weight of the remover composition. The content of the organic phosphonic acid is preferably from 1 to 10% by weight, more preferably from 1.5 to 8% by weight, and even more preferably from 2 to 6% by weight, of the remover composition, from the viewpoint of excellent corrosion resistance to metal line, prevention of an organic amine from being added in excess and environmental issues including waste liquid treatment and the like. In addition, of the environmental issues such as waste liquid treatment, the content of the organic phosphonic acid is preferably from 0.05 to 6% by weight, and more preferably from 0.2 to 3% by weight, of the remover composition, from the viewpoint of reduction of COD and from the viewpoint of pH stability.

In the present invention, the linear sugar alcohol (C) includes a tetritol, a pentitol, a hexitol, a heptitol, an octitol, a nonitol or the like, from the viewpoint of enhancing corrosion resistance especially in a case where the linear sugar alcohol is contacted with the line containing aluminum. The tetritol includes, for example, threitol, erythritol, and the like. The pentitol includes, for example, arabitol, ribitol (adonitol), xylitol, lyxitol, and the like. The hexitol includes, for example, linear sugar alcohols such as sorbitol, mannitol, iditol, gulitol, and allodulcitol (allitol). These linear sugar alcohols can be used alone or in a mixture of two or more kinds.

Among them, xylitol, D-sorbitol and D-mannitol are preferable.

The content of the linear sugar alcohol in the remover composition of the embodiment 2 of the present invention is from 0.1 to 10% by weight of the remover composition. The content of the linear sugar alcohol is preferably from 0.5 to 10% by weight, more preferably from 1 to 7% by weight, and even more preferably from 1.5 to 5% by weight, of the remover composition, from the viewpoint of satisfying both the removability and stability in corrosion resistance in a case especially where the linear sugar alcohol is contacted with the line containing aluminum.

The weight ratio of the linear sugar alcohol (C) to a total amount of the organic amine (A) and the organic phosphonic acid (B) in the remover composition of the embodiment 2 of the present invention, i.e. (C)/((A)+(B)), is preferably from 1/0.03 to 1/36, more preferably from 1/0.05 to 1/17, and even more preferably from 1/0.3 to 1/0.8, from the viewpoint of satisfying both removability and corrosion resistance to metal line.

The remover composition of the embodiment 1 and the embodiment 2 of the present invention has a pH at 20° C. of from 9 to 13. The remover composition has a pH of preferably from 10 to 12, and more preferably from 10 to 11.5, from the viewpoint of satisfying both removability for ashing residue and corrosion resistance to metal line. The pH can be adjusted by adding, for example, an inorganic acid such as phosphonic acid, sulfuric acid, nitric acid, phosphoric acid or hydrochloric acid; an organic acid such as acetic acid or a carboxylic acid (oxalic acid or the like); an acidic substance such as an alkylsulfuric acid; or the like. Here, the pH at 20° C. can be determined by a method known in the field of art.

In addition, it is preferable that the remover composition. of the embodiment 1 and the embodiment 2 of the present invention has a high pH stability, from the viewpoint of maintaining both removability for ashing residue and corrosion resistance to metal line upon recycle use. The pH stability of a remover composition can be evaluated by, for example, <Standard Test> described later, and a pH change before and after the test is preferably less than 0.5, and more preferably less than 0.2.

The remover composition of the embodiment 1 and the embodiment 2 of the present invention may further contain a water-soluble organic solvent, a surfactant, a fluorine-containing compound or the like, so long as the effects of the present invention are exhibited.

The water-soluble organic solvent includes, for example, γ-butyrolactone, N-methyl pyrrolidone, dimethylformamide, dimethyl sulfoxide, polyhydric alcohols such as ethylene glycol and propylene glycol, glycol ethers such as ethylene glycol monobutyl ether and diethylene glycol monobutyl ether, and the like. Among these water-soluble organic solvents, ethylene glycol and diethylene glycol monobutyl ether are preferable, and diethylene glycol monobutyl ether is more preferable, from the viewpoint of even more enhancing penetrability to ashing residue, wettability to a wafer, and water solubility.

The surfactant includes anionic surfactants such as fatty acid salts, alkyl sulfates, alkylbenzenesulfonates, polyoxyethylene alkyl ether sulfates, and dialkyl sulfosuccinates; cationic surfactants such as alkylamine acetates and quaternary ammonium salts; amphoteric surfactants such as alkyl dimethylaminoacetate betaines and alkyl dimethylamine oxides; nonionic surfactants such as glycerol fatty acid esters, propylene glycol fatty acid esters, polyoxyethylene alkyl ethers, and polyoxyethylene polyoxypropylene ethers and the like.

The fluorine-containing compound includes hydrofluoric acid, ammonium fluoride, ammonium hexafluorosilicate, ammonium hexafluorophosphate, alkylamine hydrofluorides, alkanolamine hydrofluorides, tetraalkylammonium fluorides, and the like.

The remover composition of the embodiment 1 of the present invention can be produced by mixing 1,3-propanediamine, 1-hydroxyethylidene-1, 1-diphosphonic acid, and the like with the above-mentioned water according to a known method; on the other hand, the remover composition of the embodiment 2 of the present invention can be produced by mixing the organic amine, the organic phosphonic acid, the linear sugar alcohol, and the like with the above-mentioned water according to a known method. Here, the remover composition of the present invention may be prepared as a concentrated, and diluted with water or the like upon use.

Even while the remover composition of the embodiment 1 and the embodiment 2 of the present invention thus obtained can remove away almost all of ashing residue within the holes at lower temperatures and in a shorter period of time, the remover composition has excellent corrosion resistance to metal line, particularly, metal line containing aluminum.

The present invention also provides a process for cleaning a semiconductor substrate or semiconductor element with the remover composition of the embodiment 1 and the embodiment 2 mentioned above. The process for cleaning includes an immersion cleaning method, a shake cleaning method, a paddle cleaning method, a cleaning method by spraying in air or liquid, a cleaning method using ultrasonic wave, or the like. Representative examples of the cleaning process of a semiconductor substrate or semiconductor element are a batch processing cleaning process including the step of cleaning about 25 silicon wafers in one operation, a single wafer cleaning process including the step of cleaning a silicon wafer one at a time, and the like. It is preferable that the remover composition of the present invention is used particularly in cleaning by a single wafer cleaning process because the remover composition has sufficient removability at lower temperatures in a short period of time. In addition, the remover composition of the present invention has excellent corrosion resistance to metal line, so that this single wafer cleaning process can be even applied to cleaning a semiconductor substrate or semiconductor element in which via holes are formed. On the other hand, when the remover composition of the present invention is used in cleaning by a batch processing cleaning process, sufficient removability is obtained at lower temperatures in a shorter period of time, so that it is unnecessary to clean an object for a long period of time as in a conventional method, thereby exhibiting effects such as energy saving.

In addition, since the remover composition of the present invention has sufficient removability in a shorter period of time, when viewed from the viewpoint of the cleaning time, it is preferable to apply a single wafer cleaning process in which a strict control of the cleaning time is enabled, not the batch processing cleaning process by a conventional immersion method in which control of the cleaning time is difficult. In other words, although the cleaning time in the batch processing cleaning process has a tendency conventionally that the longer the more favorable, the cleaning time in a case where the remover composition of the present invention is used may be a short period of time of 5 minutes or less, contrary to that of the batch processing cleaning process, and it is preferable that the cleaning time is even shorter so long as sufficient removability can be obtained.

The cleaning time in a case where the remover composition of the embodiment 1 is used is preferably from 10 seconds to 5 minutes, more preferably from 0.5 to 3 minutes, even more preferably from 0.5 to 2 minutes, and still even more preferably from 0.5 to 1 minute, from the viewpoint of removability for ashing residue, corrosion resistance to metal line, and safety. In addition, particularly, in a case where a remover composition without containing a linear sugar alcohol is contacted with the line containing aluminum in the remover composition of the embodiment 1, the cleaning time is preferably from 30 to 90 seconds, and more preferably from 45 to 75 seconds, from the viewpoint of satisfying both the removability and the corrosion resistance.

On the other hand, the cleaning time in a case where the remover composition of the embodiment 2 is used is preferably from 10 seconds to 5 minutes, more preferably from 0.5 to 4 minutes, and even more preferably from 0.5 to 3.5 minutes, from the viewpoint of satisfying both the removability and stability in corrosion resistance in a case where the composition is contacted with the line containing aluminum. In addition, in a case where the composition is contacted with the line containing aluminum, the cleaning time is preferably from 10 seconds to 4 minutes, and more preferably from 0.5 to 3 minutes, from the viewpoint of satisfying both the removability and the corrosion resistance.

The cleaning temperature in a case where the remover composition of the embodiment 1 and the embodiment 2 is used is preferably from 10° to 50° C., more preferably from 20° to 50° C., and even more preferably from 20° to 40° C., from the viewpoint of removability for ashing residue, corrosion resistance to metal line, safety and operability.

In the rinsing step, rinsing with water can be performed. Since a conventional ammonium fluoride-based remover or amine(such as hydroxylamine)-based remover is a solvent-based remover, the remover cannot easily be rinsed away with water, and mixing the remover With water may possibly cause corrosion of metal line, particularly metal line containing aluminum or the like, so that a method for rinsing with a solvent such as isopropanol is generally employed for the above remover. However, since the remover composition of the present invention has the features of being an aqueous system and containing an organic phosphonic acid having an action of corrosion resistance to metal line, particularly metal line containing aluminum, the resistance to corrosion of metal line, particularly metal line containing aluminum is high even when water is in excess. Accordingly, rinsing with water can be performed, whereby an economical cleaning process with extremely small load on environments can be obtained.

The present invention also provides a method for manufacturing a semiconductor substrate or semiconductor element including the step of cleaning with the process for cleaning mentioned above. The semiconductor substrate or semiconductor element obtainable by using the above-mentioned remover composition and the above-mentioned process for cleaning has hardly any remaining of ashing residue, especially ashing residue within via holes, so that corrosion of metal line, especially metal line containing aluminum, is very small.

In the manufacturing method, a specific embodiment using the remover composition of the present invention includes, for example, a manufacturing method including the steps of:
  a line-forming step including the steps of forming a metal layer and resist patterns, in this order, on one of a main face of a semiconductor substrate, and etching the metal layer with the resist patterns as a mask to form a line;
  a first ashing step including the step of ashing the resist patterns; and
  a first residue-removing step including the step of removing the residue remaining in the vicinity of the line after the first ashing step, wherein the remover composition of the embodiment 2 is used in the first residue-removing step.

In addition, the manufacturing method also includes a manufacturing method further including the steps of:
  a hole-forming step including the steps of forming an insulation layer for covering the line after the first residue-removing step, forming resist patterns on the insulation layer, and etching the insulation layer with the resist patterns as a mask to form a hole;
  a second ashing step including the step of ashing the resist patterns on the insulation layer; and
  a second residue-removing step including the steps of removing the residue remaining in the vicinity of the hole after the second ashing step, wherein the remover composition of the embodiment 1, especially the remover composition without containing a linear sugar alcohol, is used in the second residue-removing step.

The present invention is suitable in the manufacture of a semiconductor substrate or semiconductor element, having metal line containing aluminum, copper, tungsten, titanium, or the like, and is excellent in removability especially for aluminum, copper- and titanium-based oxidized products especially within via holes, and excellent in corrosion resistance to metal line containing aluminum, whereby the present invention is suitable in the manufacture of a semiconductor substrate or semiconductor element having metal line containing aluminum.

EXAMPLES

<Wafer for Evaluation>

Each of an unclean patterned wafer A (via holes) in which via holes of a diameter of 0.25 μm were formed and an unclean patterned wafer B (Al line) having aluminum (Al) line with a line width of 0.25 μm was diced into squares having a side of 1 cm each to produce wafers for evaluation.
(Structure of Patterned Wafer A)
  $SiO_2$(insulation layer)/TiN(barrier layer)/Al—Cu(electroconductive layer)/TiN/substrate
(Structure of Patterned Wafer B)
  TiN/Al—Cu/TiN/$SiO_2$/substrate Here, the via holes penetrate through the barrier layer and reach to the electroconductive layer.

Examples 1 to 5 and Comparative Example 1 to 4

Each of the remover compositions of Examples 1 to 5 and Comparative Examples 1 to 4 was prepared so as to have a composition as listed in Table 1.

Each of the remover compositions of Examples 1 to 5 and Comparative Examples 1 to 4 was subjected to <Removability Test for Ti Residue and Corrosion Resistance Test to Al Line> as detailed hereinbelow. The removability for residue containing Ti (Ti residue) and the corrosion resistance to metal line containing Al (Al line) were evaluated. in accordance with the following evaluation criteria. Further, the following "Standard Test" was conducted, and the pH stability of the remover compositions was evaluated in accordance with the following evaluation criteria. In addition, the COD was determined as prescribed in JIS K 0102 20. The results are shown in Table 1.

<Removability Test for Ti Residue and Corrosion Resistance Test to Al Line>

Ti residue and Al line within holes of an unclean patterned wafer A were observed with a FE-SEM (scanning electron microscope) at a magnification of from 50,000 to 100,000. Next, the patterned wafer A was immersed in 30 mL of the remover composition at 25° C. for 1 minute a single piece of wafer at a time. Thereafter, the patterned wafer A was taken out from the remover composition, and the patterned wafer A was immersed in 30 mL of ultrapure water at 25° C. for 1 minute. This immersion procedure in the ultrapure Water was repeated twice, and the patterned wafer A was then dried by blowing a nitrogen gas thereto. After drying, Ti residue and Al line within holes of the patterned wafer A were observed with a FE-SEM (scanning electron microscope) at a magnification of from 50,000 to 100,000. The removability and the corrosion resistance were evaluated in accordance with the following evaluation criteria in comparison to Ti residue and Al line within the holes of the patterned wafer A before the test. Here, the test was evaluated by cleaning for every single wafer.

(Removability for Ti Residue)

⊚: the residue being completely removed;
  ○: almost all the residue being removed (in other words, 50% or more of the residue being removed);
  Δ: the residue remaining in the great majority (in other words, the removal of the residue being less than 50%); and
  x: the residue not being able to be removed.

(Corrosion Resistance to Al Line)

⊚: the corrosion of Al line not being confirmed at all (in other words, the corrosion not being found at all on the exposed surface of the Al line);

○: the corrosion of Al line being partly generated (in other words, the extent of the corrosion being generated on the exposed surface of the Al line being less than 50% of the area of the exposed surface);

Δ: the corrosion of Al line being generated in the majority of Al line (in other words, the extent of the corrosion being generated on the exposed surface of the Al line being 50% or more of the area of the exposed surface); and x: the corrosion of Al line being generated (in other words, the corrosion being generated on the entire range of the exposed surface of the Al line).

<Standard Test>

(1) A 100 mL polyethylene container is charged with 100 g of a remover composition, and the pH of the composition is determined at 20° C.

(2) The container charged with the remover composition of the item (1) is immersed in a water bath, temperature-controlled to 40° C., and the content is sufficiently stirred with a magnetic stirrer for 6 hours.

(3) After the procedure of the item (2), the pH of a remover composition cooled to 20° C. is determined, and a difference with the pH determined in the item (1) is obtained to calculate a pH change before and after the test.

(pH Stability)

○: a pH change before and after the test being less than 0.2;

Δ: a pH change before and after the test being 0.2 or more and less than 0.5; and x: a pH change before and after the test being 0.5 or more.

Here, acceptable products are those in which both the removability and the corrosion resistance to line are ⊚ or ○, and the pH stability is ○ or Δ.

It can be seen from the results of Table 1 that all of the remover compositions of Examples 1 to 5 are excellent in removability for Ti residue and corrosion resistance to Al line even at lower temperatures and in a shorter period of time. On the other hand, the remover composition of Comparative Example 1 containing only 1,3-propanediamine has worsened corrosion resistance; the remover compositions of Comparative Examples 2 and 3 containing only 1-hydroxyethylidene-1,1-diphosphonic acid had worsened removability; and all of the remover compositions of Comparative Examples 1 to 3 have worsened hole cleanability. In addition, the remover compositions of Examples 1 to 5 have excellent pH stability, and the remover compositions of the present invention are water-based, as compared to Comparative Example 4 which is a solvent based; therefore, the remover compositions have lower COD, so that the loads to environments can be reduced.

Examples 6 to 11 and Comparative Example 5 Remover compositions having compositions listed in Table 2 (numerical values being expressed as % by weight) were prepared, and the resulting remover compositions were subjected to <Removability Test for Al Line and Corrosion Resistance Test to Al Line> as detailed hereinbelow. Here, the remover composition of Example 6 is the same one as the remover composition of Example 3 prepared above. Contrary from the above test, the test was conducted by changing the immersion time of the wafer into the remover composition from 1 minute to 90 seconds and 180 seconds, and the remover composition was evaluated for removability for residue (ashing residue) and corrosion resistance to metal line containing Al (Al line) in accordance with the following evaluation criteria. The results are shown in Table 2.

TABLE 1

| | Ex. | | | | | Comp. Ex. | | | |
|---|---|---|---|---|---|---|---|---|---|
| | 1 | 2 | 3 | 4 | 5 | 1 | 2 | 3 | 4 |
| Remover Composition (% by weight) | | | | | | | | | |
| PDA*[1] | 9.92 | 3.89 | 0.85 | 0.39 | 0.27 | 0.80 | — | — | — |
| TMAH*[2] | — | — | — | — | — | — | 0.36 | — | — |
| Hexylamine | — | — | — | — | — | — | — | 1.01 | — |
| HEDP*[3] | 8 | 2.17 | 0.4 | 0.16 | 0.1 | — | 0.40 | 0.40 | — |
| PDA/HEDP | 1.2 | 1.8 | 2.1 | 2.4 | 2.7 | 0 | 0 | 0 | — |
| Oxalic Acid (Anhydride)*[4] | — | — | — | — | — | — | — | — | — |
| Sulfuric Acid*[5] | — | — | — | — | — | 0.18 | — | — | — |
| Ammonium Fluoride | — | — | — | — | — | — | — | — | 0.5 |
| DMSO*[6] | — | — | — | — | — | — | — | — | 70 |
| Ultrapure Water | 82.08 | 93.94 | 98.75 | 99.45 | 99.63 | 99.02 | 99.24 | 98.59 | 29.5 |
| Physical Properties | | | | | | | | | |
| pH*[7] | 11.1 | 11.1 | 11.1 | 11.1 | 11.1 | 11.1 | 11.1 | 11.1 | 9.8 |
| Removability*[8] | ⊚ | ⊚ | ⊚ | ⊚ | ○ | ⊚ | X | X | X |
| Corrosion Resistance*[9] | ⊚ | ⊚ | ⊚ | ⊚ | ⊚ | X | ⊚ | ⊚ | ⊚ |
| pH Stability | ○ | ○ | ○ | Δ | Δ | ○ | Δ | X | X |
| COD (mg/L)*[10] | 45000 | 12000 | 2800 | 1300 | 1100 | 2600 | 1100 | 27000 | 160000 |

*[1]PDA is 1,3-propanediamine.
*[2]TMAH is tetramethylammonium hydroxide.
*[3]HEDP is 1-hydroxyethylidene-1,1-diphosphonic acid.
*[4]Oxalic acid was added for adjusting pH.
*[5]Sulfuric acid was added for adjusting pH.
*[6]DMSO is dimethyl sulfoxide.
*[7]pH is a value determined at 20° C.
*[8]The removal ratio of the residue was evaluated.
*[9]Area ratio of the corroded portions generated on exposed surface of aluminum line was evaluated.
*[10]COD is chemical oxygen demand.

<Removability Test for Al Line and Corrosion Resistance Test to Al Line>

Al line and ashing residue of an unclean patterned wafer B were observed with a FE-SEM (scanning electron microscope) at a magnification of from 50,000 to 100,000. Next, the patterned wafer B was immersed in 30 mL of the remover composition at 25° C. for 90 seconds or 180 seconds. Thereafter, the patterned wafer B was taken out from the remover composition, and the patterned wafer B was immersed in 30 mL of ultrapure water at 25° C. for 1 minute. This immersion procedure in the ultrapure water was repeated twice, and the patterned wafer B was then dried by blowing a nitrogen gas thereto. After drying, Al line and ashing residue of the patterned wafer B were observed with a FE-SEM (scanning electron microscope) at a magnification of from 50,000 to 100,000. The removability and the corrosion resistance were evaluated in accordance with the following evaluation criteria in comparison to Al line and ashing residue of the patterned wafer B before the test. Here, the test was evaluated by cleaning for every single wafer.

(Removability for Ashing Residue)

⊚: the remaining of residue being not confirmed at all;

◯: the residue being partly removed (in other words, 50% or more of the residue being removed);

Δ: the residue remaining in the great majority (in other words, the removal of the residue being less than 50%); and x: the residue not being able to be removed.

(Corrosion Resistance to Al Line)

⊚: the corrosion of Al line not being confirmed at all (in other words, the corrosion not being found at all on the exposed surface of the Al line);

◯: the corrosion of Al line being partly generated (in other words, the extent of the corrosion being generated on the exposed surface of the Al line being less than 50% of the area of the exposed surface);

Δ: the corrosion of Al line being generated in the majority of Al line (in other words, the extent of the corrosion being generated on the exposed surface of the Al line being 50% or more of the area of the exposed surface); and x: the corrosion of Al line being generated (in other words, the corrosion being generated on the entire range of the exposed surface of the Al line).

Here, acceptable products are those in which both the removability and the corrosion resistance to line are ⊚ or ◯.

TABLE 2

|  | Ex. 6 | Ex. 7 | Ex. 8 | Ex. 9 | Ex. 10 | Ex. 11 | Comp. Ex. 5 |
| --- | --- | --- | --- | --- | --- | --- | --- |
| Remover Composition (% by weight) | | | | | | | |
| PDA*1 | 0.40 | 0.40 | 0.40 | 0.40 | 0.40 | 0.40 | — |
| HEDP*2 | 0.85 | 0.85 | 0.85 | 0.85 | 0.85 | 0.85 | — |
| D-Sorbitol | — | — | 2.00 | 3.00 | 4.00 | — | — |
| D-Mannitol | — | — | — | — | — | 3.00 | — |
| myo-Inositol | — | 3.00 | — | — | — | — | — |
| Linear Sugar Alcohol/(PDA + HEDP) | — | — | 1.6 | 2.4 | 3.2 | 2.4 | — |
| Ammonium Silicofluoride | — | — | — | — | — | — | 0.05 |
| Dq2000*3 | — | — | — | — | — | — | 0.15 |
| Ammonia | — | — | — | — | — | — | 0.1 |
| Ultrapure Water | 98.75 | 95.75 | 96.75 | 95.75 | 94.75 | 95.75 | 99.70 |
| Physical Properties | | | | | | | |
| pH*4 | 11.1 | 11.1 | 11.1 | 11.1 | 11.1 | 11.1 | 4.0 |
| Removability*5 (90 seconds) | ⊚ | ⊚ | ⊚ | ⊚ | ◯ | ⊚ | ⊚ |
| Corrosion Resistance*6 (90 seconds) | ◯ | ◯ | ⊚ | ⊚ | ⊚ | ⊚ | X |
| Removability (180 seconds) | ⊚ | ⊚ | ⊚ | ⊚ | ⊚ | ⊚ | ⊚ |
| Corrosion Resistance (180 seconds) | X | X | ◯ | ⊚ | ⊚ | ⊚ | X |

*1 PDA is 1,3-propanediamine.
*2 HEDP is 1-hydroxyethylidene-1,1-diphosphonic acid.
*3 Dq2000 is aminotri(methylenephosphonic acid).
*4 pH is a value determined at 20° C.
*5 The removal ratio of the residue was evaluated.
*6 Area ratio of the corroded portions generated on exposed surface of aluminum line was evaluated.

From the results of Table 2, the remover compositions obtained in Examples 8 to 11 showed favorable results for the removability for ashing residue and the corrosion resistance to Al line in both the cleaning time of 90 seconds and 180 seconds. In addition, while the remover composition of Example 6 without containing a linear sugar alcohol showed favorable cleanability even in a cleaning time of 90 seconds, as compared to the cleanability at the cleaning time conducted above (1 minute), but worsened corrosion resistance at a cleaning time of 180 seconds. Similarly, the remover composition of Example 7 containing a cyclic sugar alcohol but without containing a linear sugar alcohol also showed favorable cleanability at a cleaning time of 90 seconds, but worsened corrosion resistance at a cleaning time of 180 seconds. On the other hand, from the results of Comparative Example 5, a general remover composition, the remover composition showed the results favorable in removability even at a cleaning time of 180 seconds, but worsened in corrosion resistance even at a cleaning time of 90 seconds. Therefore, the remover composition of the present invention exhibits excellent cleanability in a shorter period of time, and a remover composition further added with a linear sugar alcohol can exhibit excellent corrosion resistance even in a case where the cleaning time is extended to a certain extent, thereby facilitating time control.

INDUSTRIAL APPLICABILITY

The remover composition of the present invention has excellent removability for a resist residue generated during the formation of a semiconductor element and a metal oxide product derived from metal line at lower temperatures and in a shorter period of time, and also has excellent corrosion resistance to metal line, particularly metal line containing aluminum. Therefore, by using the remover composition of the present invention, effects such as a recent requirement for more limited production of diversified semiconductor elements can be satisfied, speeding up and higher degree of integration of semiconductor elements can be accomplished, and high-quality electronic parts such as LCD, memory, and CPU can be manufactured are exhibited.

The invention claimed is:

1. A process for cleaning a semiconductor substrate or semiconductor element, comprising the step of cleaning the semiconductor substrate or semiconductor element with a remover composition comprising:

(A) an organic amine, (B) an organic phosphonic acid, (C) a linear sugar alcohol, and water, wherein the remover composition comprises the component (A) in an amount of from 0.2 to 30% by weight, the component (B) in an amount of from 0.05 to 10% by weight, the component (C) in an amount of from 0.1 to 10% by weight, and the water in an amount of from 50 to 99.65% by weight, a weight ratio of the component (C) to a total amount of the component (A) and the component (B) in the remover composition is from 1/0.3 to 1/0.8, and wherein the remover composition has a pH at 20° C. of from 9 to 13.

2. The process according to claim 1, wherein the semiconductor substrate or semiconductor element is cleaned according to a single wafer cleaning process.

3. The process according to claim 1, wherein the cleaning is for 3 minutes or less in a case where the remover composition is contacted with a metal line containing aluminum.

* * * * *